(12) United States Patent
Gonzalez et al.

(10) Patent No.: US 6,664,198 B1
(45) Date of Patent: Dec. 16, 2003

(54) METHOD OF FORMING A SILICON NITRIDE DIELECTRIC LAYER

(75) Inventors: Fernando Gonzalez, Boise, ID (US); John Zhang, Boise, ID (US); Er-Xuan Ping, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/190,261

(22) Filed: Jul. 3, 2002

(51) Int. Cl.[7] .................... H01L 21/8242; H01L 21/31; H01L 21/469
(52) U.S. Cl. .............. 438/775; 438/239; 438/251; 438/766
(58) Field of Search ................ 438/239, 251, 438/766, 775

(56) References Cited

U.S. PATENT DOCUMENTS

| 5,663,087 A | 9/1997 | Yokozawa |
| 6,200,844 B1 | 3/2001 | Huang |
| 6,251,761 B1 | 6/2001 | Rodder et al. |
| 6,528,384 B2 * | 3/2003 | Beckmann et al. ......... 438/386 |
| 2001/0012701 A1 | 8/2001 | Kang et al. |
| 2002/0019142 A1 | 2/2002 | Moore |

* cited by examiner

*Primary Examiner*—Alexander Ghyka
(74) *Attorney, Agent, or Firm*—Dinsmore & Shohl LLP (57) ABSTRACT

Methods of forming thin nitride dielectric layers for semiconductor devices are provided. Additionally, methods of forming capacitor structures utilizing thin nitride dielectric layers are provided. The thin nitride layers are formed by nitridizing the surface of a doped or undoped semiconductor substrate using a remote plasma nitridization or a rapid thermal nitridization to form a first growth of silicon nitride. A self-limiting second growth of silicon nitride is formed using a remote plasma nitridization. The resulting silicon nitride layers exhibit improved dielectric and leakage characteristics.

48 Claims, 4 Drawing Sheets

METHOD OF FORMING A SILICON NITRIDE DIELECTRIC LAYER

BACKGROUND OF THE INVENTION

The present invention relates generally to silicon nitride film growth, and in particular the present invention relates to the formation of ultra-thin silicon nitride films useful in semiconductor devices such as capacitor structures for integrated circuits.

Remote plasma nitridization (RPN) has been utilized to grow self-limiting ultra-thin nitride films. These ultra-thin films make good dielectric barrier layers in semiconductor devices. For example, dynamic random access memory (DRAM) cells typically comprise a metal-oxide-semiconductor transistor (MOS) and a capacitor used to store signals therein. The capacitors in DRAM cells often utilize an ultra-thin nitride film grown by RPN to act as a dielectric. Higher temperature RPN films are desirable because the films have a slightly higher dielectric constant (k) value that allows the capacitor to store more charges per unit surface area of the capacitor. However, the defectivity in nitride films grown by RPN increases as the temperature during growth increases. Typically, capacitors utilizing nitride films grown by RPN exhibit higher defectivity as evidenced by an increase in capacitor leakage.

Doping and anneals have also been used in semiconductor device manufacturing to condition and dope polysilicon surfaces. For example phosphorous and boron anneals utilizing a rapid thermal process (RTP) may be used to form n-type or p-type lower capacitor electrodes respectively. It is desirable to form silicon nitride films on doped lower electrodes in capacitor structures. However, the doping and the growth of silicon nitride films are generally performed as separate process steps. Thus, there is a need for a process that can integrate doping and nitridization to form ultra-thin nitride films having reduced film defectivity.

SUMMARY OF THE INVENTION

This need is met by the present invention that provides methods for forming thin silicon nitride films. These methods may be used in conjunction with conventional processing to provide capacitors having improved cell leakage characteristics.

In accordance with one embodiment, methods of forming a thin dielectric layer for use in a semiconductor device are provided. The methods comprise providing a semiconductor substrate having a surface comprising silicon and forming a silicon nitride layer on the surface. The substrate may be doped with dopant prior to the step of forming the silicon nitride layer, and the dopant may typically comprise arsenic, boron or phosphorous. The doping may be by a rapid thermal anneal (RTA), and the doping may be carried out at temperature of about 700° C. to about 800° C.

The step of forming the silicon nitride layer may comprise nitridizing the surface of the substrate in a vacuum to form a first growth of silicon nitride and nitridizing the first growth of silicon nitride to form a second growth of silicon nitride. The first growth and the second growth of silicon nitride together comprise the silicon nitride layer. The second growth of silicon nitride is generally self-limiting. The first growth of silicon nitride may be formed in the same process chamber as the doping, and the second growth of silicon nitride may be formed in the same process chamber or a second process chamber. The step of nitridizing the surface of the substrate to form a first growth may be accomplished using a rapid thermal nitridization or a remote plasma nitridization. The remote plasma nitridization may use $NH_3$. The step of nitridizing the second growth may be accomplished using remote plasma nitridization or rapid thermal nitridization, and the remote plasma nitridization may use $N_2$. The forming of the silicon nitride layer may be carried out at a temperature of about 700° C. to about 800° C. The silicon nitride layer is generally less than about 40 Å thick, and the layer is more generally about 10–25 Å thick.

In an alternative embodiment, methods of forming a capacitor are provided. The methods involve forming a lower capacitor electrode, placing the lower capacitor electrode in a vacuum, doping the lower electrode in said vacuum, forming a silicon nitride layer on the surface of the lower electrode, and forming an upper capacitor electrode. The lower electrode may comprise polysilicon or hemispherical grained silicon. The doping of the electrode will generally comprise a rapid thermal anneal. The electrode may be doped with an p-type or n-type dopant. Boron is suitable p-type dopant. Arsenic and phosphorous are suitable n-type dopants. The electrode may be doped at a temperature of about 700° C. to 800° C.

The step of forming a silicon nitride layer on the surface of the lower electrode generally comprises nitridizing the surface of the substrate in the vacuum to form a first growth of silicon nitride and nitridizing the first growth of silicon nitride to form a second growth of silicon nitride. The first growth and the second growth of silicon nitride together comprise the silicon nitride layer. The second growth of silicon nitride is generally self-limiting. The step of nitridizing the surface of the lower electrode to form a first growth of silicon nitride may be accomplished using a rapid thermal nitridization or a remote plasma nitridization. The remote plasma nitridization may use $NH_3$. The step of nitridizing the first growth may be accomplished using remote plasma nitridization or rapid thermal nitridization, and the remote plasma nitridization may use $N_2$. The first growth of silicon nitride may be formed in the same process chamber used for doping, and the second growth of silicon nitride may be formed in a second process chamber. Alternatively, the doping, first growth, and second growth may be carried out in the same process chamber. The silicon nitride layer may be formed at a temperature of about 700° C. to about 800° C. The silicon nitride layer is generally less than about 40 Å thick, and the layer is more generally about 10–25 Å thick.

DETAILED DESCRIPTION OF THE PREFERRED EMBODIMENTS

The present invention is directed toward methods of forming silicon nitride dielectric layers. The methods allow ultra-thin silicon nitride layers exhibiting improved leakage characteristics to be formed, and the methods may be easily integrated into conventional processing systems.

In the following detailed description of the preferred embodiments, reference is made to the accompanying drawings that form a part hereof, and in which is shown by way of illustration, and not by way of limitation, specific preferred embodiments in which the invention may be practiced. It is to be understood that other embodiments may be utilized and that logical, mechanical, and electrical changes may be made without departing from the spirit and scope of the present invention. In the drawings, like numerals describe substantially similar components throughout the several views.

It shall be observed that the process steps and structures described herein do not form a complete process flow for manufacturing integrated circuits. The present invention can be practiced in conjunction with a variety of integrated circuit fabrication techniques, including those techniques currently used in the art. As such, commonly practiced process steps are included in the description herein only if those steps are necessary for an understanding of the present invention.

Figure 1A:
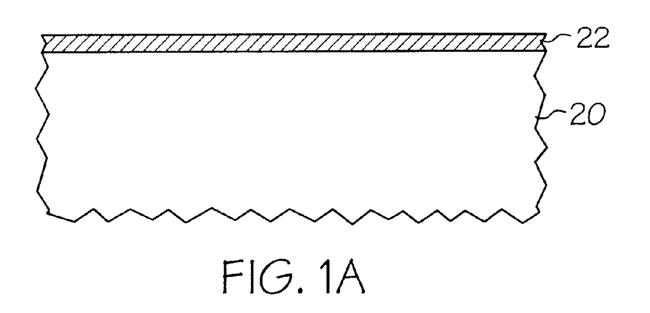
FIGS. 1a–1c illustrate the formation of a silicon nitride layer in a stepwise fashion.

FIG. 1a shows a semiconductor substrate 20. As used herein, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The semiconductor substrate 20 will generally have a surface comprising silicon, and the surface will typically comprise polysilicon.

The semiconductor substrate 20 may be doped with a dopant. The doping of the semiconductor substrate is typically carried out in a vacuum. The substrate 20 may be doped with a p-type or n-type dopant depending on the desired application. The p-type dopant is generally boron. The n-type dopant is generally phosphorous or arsenic. Typically, the substrate 20 will be doped with phosphorous. The doping is generally accomplished by performing a rapid thermal anneal (RTA). During a RTA, the substrate is heated to a high temperature in a process chamber for short periods of time in the presence of a precursor gas containing the desired dopant. The semiconductor substrate is simultaneously doped and annealed. When phosphorous doping of the substrate 20 is performed, phosphine gas ($PH_3$) is generally used for the RTA. When boron doping of the substrate 20 is performed, borane ($BH_3$), diborane ($B_2H_6$) boron trichloride ($BCl_3$), or boron trifluoride ($BF_3$) may be used as gases for the RTA. When arsenic doping of the substrate is performed, arsine ($AH_3$) gas may be used for the RTA. The RTA is generally carried out at a temperature of about 700–800° C. Generally, the RTA will last from about 10 seconds to about 5 minutes. For example, the RTA may last about 2 minutes. The gas containing the precursor may have a flow rate of about 1 standard cubic centimeters per minute (sccm) to 10 standard liters per minute (SLM). The RTA may be performed using a rapid thermal processing chamber such as a Radiance Centura System® available from Applied Materials Inc.

Figure 1B:
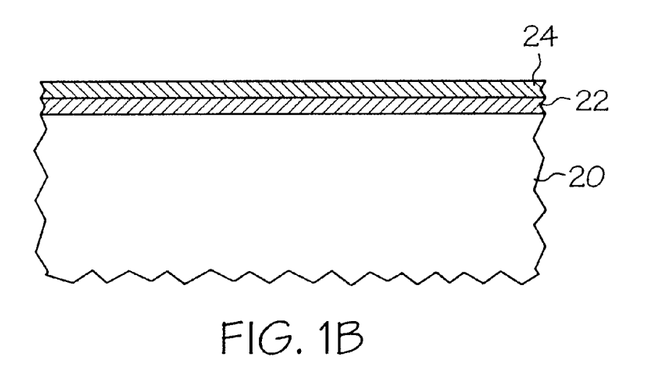

A first growth of silicon nitride 22 is formed by nitridizing the semiconductor substrate 20. As used herein, the term "nitridizing" is defined to mean reacting silicon from a semiconductor substrate with a nitrogen species to form a silicon nitride. It is to be understood that the term "silicon nitride" includes silicon nitrides that have non-stoichiometric amounts of silicon and/or nitrogen and silicon nitrides containing various impurities such as hydrogen, carbon, and the like. The first growth 22 may be formed on a doped semiconductor substrate or the first growth may be formed on an undoped semiconductor substrate. Generally, first growth 22 is formed subsequent to or during the doping of the substrate 20. The first growth of silicon nitride 22 is generally formed in a vacuum. The first growth of silicon nitride 22 is preferably formed in the vacuum used during the doping of the substrate 20. Therefore, the doping and the formation of the first growth of silicon nitride 22 may be performed in the same process chamber under vacuum, and there is no residual oxidation of the substrate 20 before the first growth of silicon nitride 22 is formed. Alternatively, the nitridization may be performed in a process chamber different than the one used to dope the substrate 20. The first growth of silicon nitride 22 is generally from about 10 Å to about 40 Å thick, more typically about 10 Å to about 15 Å angstroms thick.

The first growth of silicon nitride 22 may be formed on the semiconductor substrate 20 using rapid thermal nitridization (RTN) or the semiconductor substrate may be nitridized using remote plasma nitridization (RPN). During RTN, the semiconductor substrate 20 is rapidly heated and the surface is reacted with nitrogen to form a first growth 22 of silicon nitride thereon ($Si_3N_4$). The RTN step is generally performed at a temperature of about 700° C. to 800° C. with a nitrogen containing gas such as ammonia ($NH_3$), nitrogen trifluoride $NF_3$, nitrogen trichloride $NCl_3$, and the like. Generally, the RTN will last from about 10 seconds to about 5 minutes. For example the RTN may last about 30 seconds. The gas may have a flow rate of about 1 sccm to 10 SLM. The RTN may be performed in the same process chamber as the doping of the substrate 20. When RTN is performed in the same process chamber as the doping of the substrate, the RTN may begin before the doping of the substrate 20 is completed and may continue after the termination of the flow of gas containing the dopant. Alternatively, the RTN may begin subsequent to the doping of the substrate 20. If the RTN is performed in a process chamber that is different from the process chamber used for doping the substrate 20, the substrate 20 may be transferred from chamber to chamber in an oxygenless environment to prevent oxidation of the substrate 20.

During RPN, the surface of the semiconductor substrate 20 is reacted with nitrogen that has been excited to form a first growth 22 of silicon nitride thereon. RPN treatments are well documented in the art, and, as will be appreciated by the skilled artisan, any suitable RPN treatment may be used in the context of this invention. For example, high density plasma (HDP) RPN may be used. However, a thermal RPN using microwave plasma to excite the nitrogen molecules in the process environment is generally used. Generally, $NH_3$ and helium gas will be used in the RPN process to provide the excited nitrogen species. Alternatively, other nitrogen containing gases such as nitrogen trifluoride $NF_3$, nitrogen trichloride $NCl_3$, and the like may be used in the RPN process. The RPN is generally carried out at a temperature of about 700° C. to 850° C. Generally, the RPN will last from about 10 seconds to about 5 minutes. For example, the RPN may last about 20 seconds. The gas may have a flow rate of about 1 sccm to 10 SLM.

Figure 2:
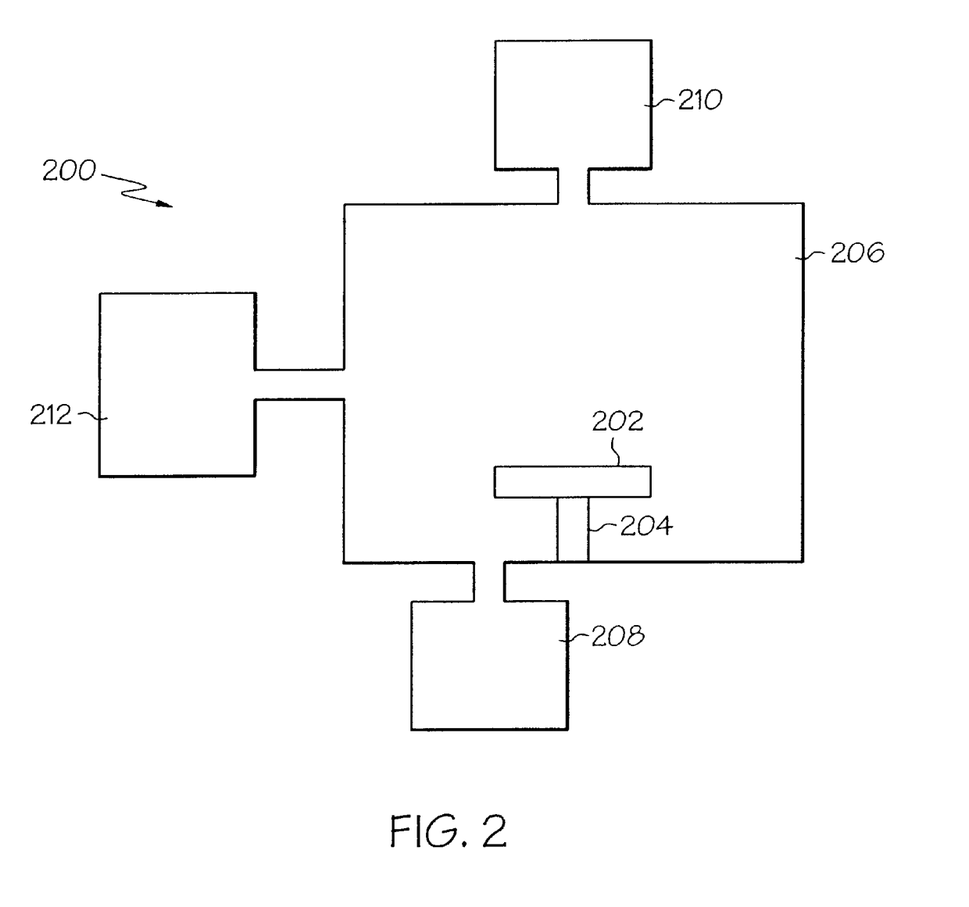
FIG. 2 is a schematic illustration of a system useful for forming a silicon nitride layer.

The RPN to form the first growth 22 may be carried out in a chamber separate from that used for doping the substrate 20, and, if the RPN is performed in a separate chamber, the substrate 20 may be transferred from chamber to chamber in an oxygenless environment. Alternatively, the RPN or RTN used to form the first growth of silicon nitride 22 may be performed using a system configuration as shown in FIG. 2. The system configuration 200 incorporates rapid thermal processing with remote plasma nitridization to allow the doping and the formation of the first growth of silicon nitride 22 to be performed in a single process chamber. The configuration 200 includes a process chamber 206 with a holder 204 for substrate 202. The process chamber has a vacuum system 208 and a rapid thermal component 210. Rapid thermal component 210 will generally include a heat source to rapidly heat the substrate 202 and gas inlets or a gas chamber. The process chamber also includes a remote plasma component 212, and the remote plasma component 212 will generally include a microwave plasma generating component including gas inlets or chambers for the appropriate gases. Thus, the RTA, RTN, and RPN may be performed using a single process chamber. Additionally, subsequent process steps may be performed using the configuration illustrated in FIG. 2.

Figure 1C:
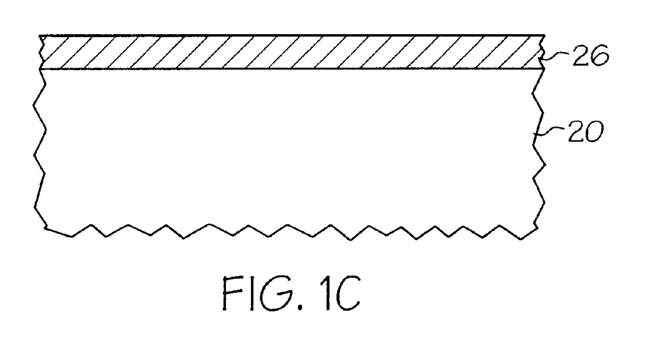

Referring to FIGS. 1b and 1c, a second growth of silicon nitride 24 is formed, and the first and second growths of silicon nitride 22, 24 together form a thin silicon nitride layer 26. The second growth of silicon nitride 24 is generally self-limiting. The second growth of silicon nitride 24 is self-limiting because the growth occurs by exposing a substrate 20 containing silicon and a first growth of silicon nitride 22 to a gas containing a nitrogen species. As the second growth of silicon nitride 24 is formed on the substrate, the nitrogen from the gas must diffuse through the first growth of silicon nitride 22 to grow more silicon nitride. Therefore, as the thickness of the second growth of silicon nitride 24 increases, diffusion of the nitrogen through the layer becomes more difficult and eventually no further silicon nitride formation is possible. The resulting silicon nitride layer 26 will generally have a thickness of less than about 40 Å, more typically about 10 Å to about 25 Å. The second growth of silicon nitride 24 may be formed by RTN or RPN. The RTN may be performed at a temperature of about 700° C. to 800° C. with a nitrogen containing gas such as ammonia ($NH_3$), nitrogen trifluoride $NF_3$, nitrogen trichloride $NCl_3$, and the like. Generally, the RTN will last from about 10 seconds to about 5 minutes. For example the RTN may last about 30 seconds. The gas may have a flow rate of about 1 sccm to 10 SLM. The RPN used to form the second growth 24 is generally performed at a temperature of about 700° C. to about 800° C. Typically, nitrogen ($N_2$) and helium will be used as the gases for the RPN. Generally, the RPN will last from about 10 seconds to about 5 minutes. For example, the RPN may last about 20 seconds. The gas may have a flow rate of about 1 sccm to 10 SLM. The RPN for the second growth 24 may be performed in a separate process chamber from the chamber used for doping the substrate 20. Alternatively, the RPN for the second growth 24 may be performed in the same process chamber as the chamber used for doping as illustrated in FIG. 2. Similarly, the RTN for the second growth 24 may be performed the same process chamber or a different process chamber than the one used for doping the substrate 20.

The second growth of silicon nitride 24 may allow the resulting silicon nitride layer 26 to recover defects caused by the high temperature of the processes used to form the first growth of silicon nitride 22. Additionally, because the second growth is self limiting, the stoichiometry of the resulting silicon nitride layer is changed relative to the stoichiometry of the first growth 22. The resulting silicon nitride layer is generally denser than the first growth. This results in an improved dielectric layer.

Figure 3A:
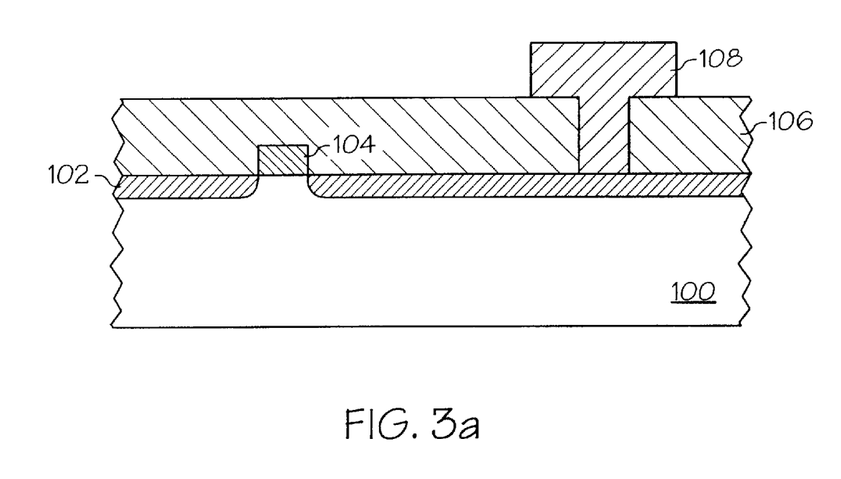
FIGS. 3a–3d illustrate the formation of a capacitor in a stepwise fashion.

Referring to FIG. 3a, a cross-section of an integrated circuit containing a MOS transistor and a capacitor electrode is shown in schematic form. A substrate 100 is provided. A MOS transistor 104 and an insulating layer 106 are formed on the substrate 100. A storage electrode lower electrode 108 of a capacitor contacts a source/drain region 102 of the MOS transistor 104. The lower electrode 108 is generally comprised of an electrically conductive form of silicon. Typically, the lower electrode 108 will be comprised of polysilicon or hemispherical grained silicon (HSG). Processes well known in the art may be utilized to form the transistor and capacitor electrode structure.

Figure 3B:
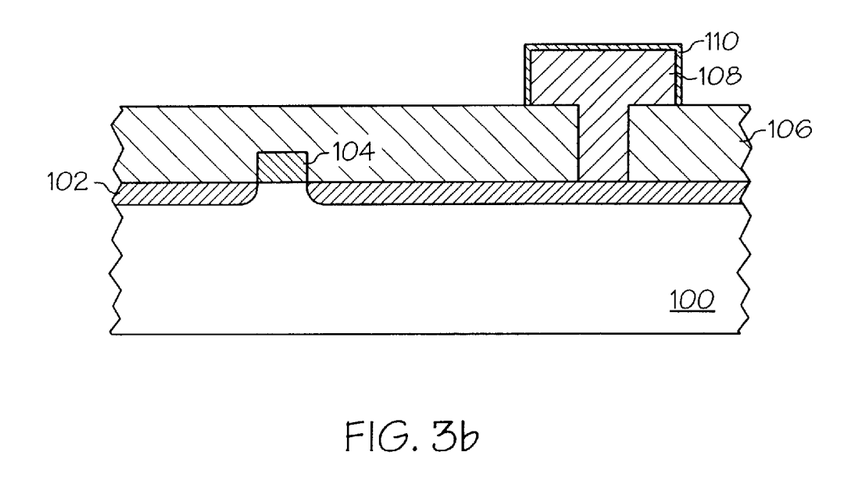
Figure 3C:
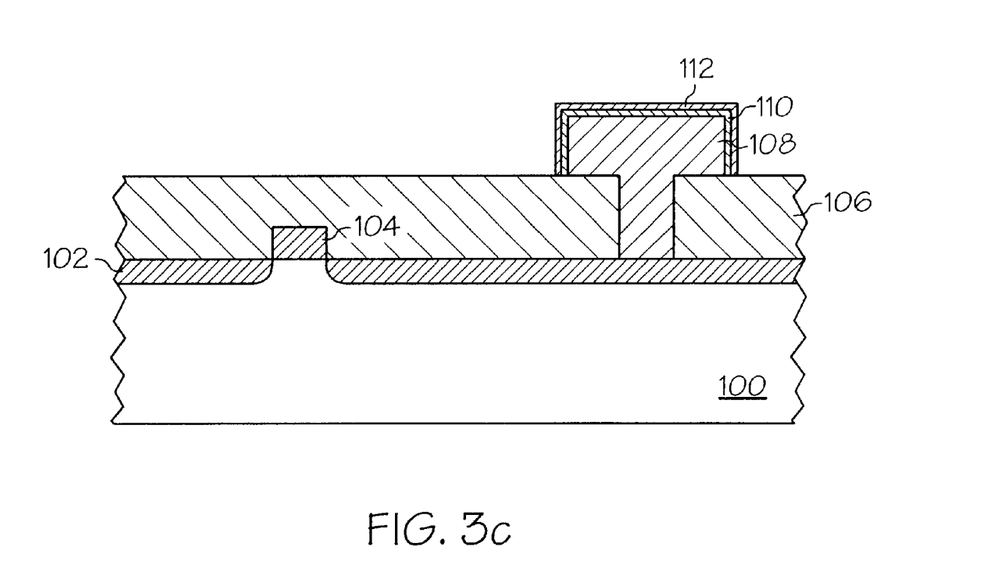

Referring to FIGS. 3b and 3c, a first growth of silicon nitride 110 is formed on the surface of the lower electrode 108. Lower electrode 108 may be doped in accordance with the methods discussed above, or lower electrode 108 may be undoped. Generally, the lower electrode 108 is doped in a vacuum with a p-type or n-type dopant, and the first growth of silicon nitride 110 is formed in accordance with the methods discussed above. Therefore, the first growth 110 may be formed using RTN or RPN, and the first growth 110 may be formed in the same process chamber or a different process chamber than that used to dope the lower electrode 108.

Figure 3D:
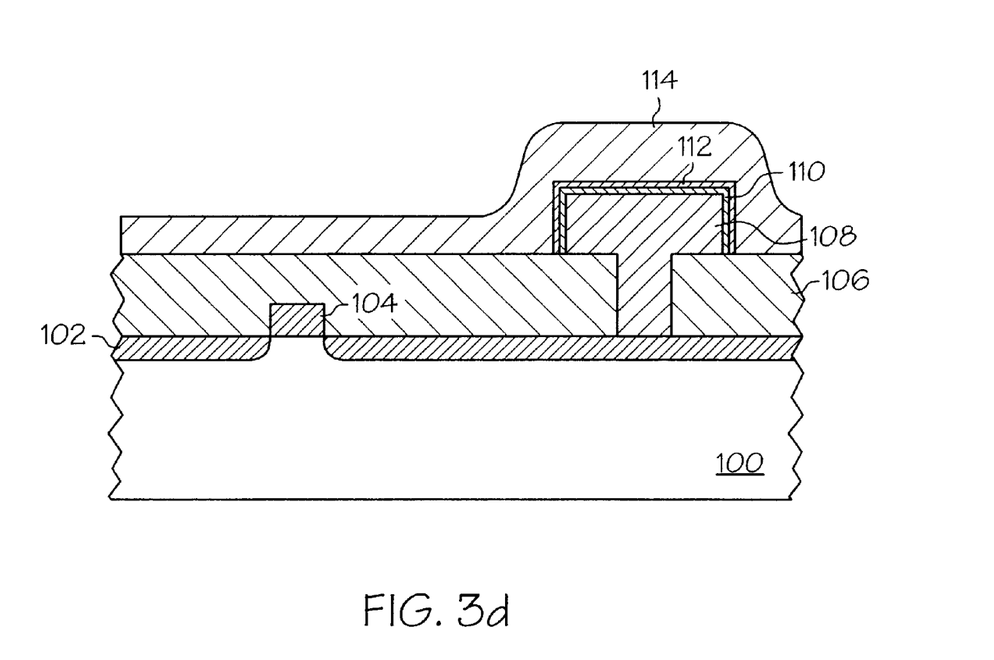

A second growth of silicon nitride 112 is subsequently formed on the first growth of silicon nitride 110. The second growth of silicon nitride 112 is formed in accordance with the methods discussed above. Therefore, the second growth 112 may be formed by RTN or RPN in a process chamber that is the same as or different from that used to form the first growth 110. The first and second growths 110, 112 form a thin silicon nitride layer that acts as a dielectric in the capacitor structure. The silicon nitride layer is generally less than about 40 Å thick, more typically about 10 Å to 25 Å thick. A conductive layer 114 is subsequently deposited over the silicon nitride growths 110 and 112, and conductive layer 114 acts as the upper capacitor electrode. Conductive layer 114 may be any material used in the art to form capacitor electrodes, and conductive layer 114 is deposited in accordance with processes that are well known in the art.

Capacitors formed in accordance with these methods will generally exhibit about a 25% to 75% improvement in cell capacitor leakage and a 15% to 40% improvement in the depletion of the capacitance over those formed using prior art processes. Additionally, when the lower capacitor electrode is doped with a dopant such as phosphorous, dangling bonds in the silicon nitride film are passivated by the dopant. Silicon-phosphorous bonds have a higher dipole strength than a silicon-oxygen or silicon-hydrogen bond. Therefore, the resulting silicon nitride film has a higher dielectric constant than a film formed on an undoped lower capacitor electrode.

It will be obvious to those skilled in the art that various changes may be made without departing from the scope of the invention, which is not to be considered limited to the specific embodiments in the specification.

What is claimed is:

1. A method of forming a thin dielectric layer for use in a semiconductor device comprising:
   providing a semiconductor substrate having a surface comprising silicon; and
   forming a silicon nitride layer on said surface, wherein the step of forming said silicon nitride layer comprises:
      nitridizing said surface of said substrate in a vacuum to form a first growth of silicon nitride;
      nitridizing said first growth of silicon nitride to form a second growth of silicon nitride, wherein said first growth and said second growth of silicon nitride together comprise said silicon nitride layer.

2. A method of forming a thin dielectric layer for use in a semiconductor device comprising:

providing a semiconductor substrate having a surface comprising silicon;

doping said semiconductor substrate with a dopant in a vacuum; and forming a silicon nitride layer on said surface, wherein the step of forming said silicon nitride film comprises:
nitridizing said surface of said substrate in a vacuum to form a first growth of silicon nitride;
nitridizing said first growth of silicon nitride to form a self-limiting second growth of silicon nitride, wherein said first growth and said second growth of silicon nitride together comprise said silicon nitride layer.

3. The method as claimed in claim 2 wherein said silicon nitride layer is less than 40 Å thick.

4. The method as claimed in claim 2 wherein said dopant comprises phosphorous, arsenic, or boron.

5. The method as claimed in claim 2 wherein said step of doping said substrate comprises performing a phosphorous anneal utilizing rapid thermal processing of said substrate.

6. A method of forming a thin dielectric layer for use in a semiconductor device comprising:
providing a semiconductor substrate having a surface comprising silicon;
doping said semiconductor substrate with a dopant in a vacuum, wherein said doping comprises a rapid thermal anneal; and
forming a silicon nitride layer on said surface, wherein the step of forming said silicon nitride layer comprises:
nitridizing said surface of said substrate in said vacuum using rapid thermal nitridization to form a first growth of silicon nitride subsequent to said doping;
nitridizing said first growth of silicon nitride using remote plasma nitridization to form a self-limiting second growth of silicon nitride, wherein said first growth and said second growth of silicon nitride together comprise said silicon nitride layer.

7. The method as claimed in claim 6 wherein said silicon nitride layer is less than 40 Å thick.

8. The method as claimed in claim 7 wherein said dopant comprises phosphorous, arsenic, or boron.

9. A method of forming a thin dielectric layer for use in a semiconductor device comprising:
providing a semiconductor substrate comprising silicon;
doping said semiconductor substrate with a dopant in a vacuum, wherein said doping comprises a rapid thermal anneal; and
forming a silicon nitride layer on said surface, wherein the step of forming said silicon nitride layer comprises:
nitridizing said surface of said substrate in said vacuum using remote plasma nitridization to form a first growth of silicon nitride subsequent to said doping;
nitridizing said first growth of silicon nitride using remote plasma nitridization to form a self-limiting second growth of silicon nitride, wherein said first growth and said second growth of silicon nitride together comprise said silicon nitride layer.

10. The method as claimed in claim 9 wherein said silicon nitride layer is less than 40 Å thick.

11. The method as claimed in claim 9 wherein said dopant comprises phosphorous, arsenic, or boron.

12. A method of forming a thin dielectric layer for use in a semiconductor device comprising:
providing a semiconductor substrate comprising silicon;
doping said semiconductor substrate with a dopant in a vacuum, wherein said doping comprises a rapid thermal anneal; and
forming a silicon nitride layer on said surface, wherein the step of forming said silicon nitride layer comprises:
nitridizing said surf a of said substrate in said vacuum using remote plasma nitridization to form a first growth of silicon nitride subsequent to said doping;
nitridizing said first growth of silicon nitride using rapid thermal nitridization to form a self-limiting second growth of silicon nitride, wherein said first growth and said second growth of silicon nitride together comprise said silicon nitride layer.

13. A method of forming a thin dielectric layer for use in a semiconductor device comprising:
providing a semiconductor substrate having a surface comprising silicon;
placing said semiconductor substrate in a vacuum;
doping said semiconductor substrate with a dopant in said vacuum, wherein said doping comprises a rapid thermal anneal; and
forming a silicon nitride layer on said surface, wherein the step of forming said silicon nitride layer comprises:
nitridizing said surface of said substrate in said vacuum using remote plasma nitridization utilizing $NH_3$ to form a first growth of silicon nitride subsequent to said doping;
nitridizing said first growth of silicon nitride using remote plasma nitridization utilizing $N_2$ to form a self-limiting second growth of silicon nitride, wherein said first growth and said second growth of silicon nitride together comprise said silicon nitride layer.

14. A method of forming a capacitor:
forming a lower capacitor electrode;
placing said lower capacitor electrode in a vacuum;
doping said lower electrode in said vacuum;
forming a silicon nitride layer on the surface of said lower electrode, wherein said step of forming said silicon nitride layer comprises:
nitridizing said surface of said lower electrode in said vacuum to form a first growth of silicon nitride;
nitridizing said first growth of silicon nitride to form a self-limiting second growth of silicon nitride, wherein said first growth and said second growth of silicon nitride together comprise said silicon nitride layer; and
forming an upper capacitor electrode.

15. The method as claimed in claim 14 wherein said lower electrode comprises polysilicon.

16. The method as claimed in claim 14 wherein said lower electrode comprises hemispherical grained silicon.

17. The method as claimed in claim 14 wherein said silicon nitride layer is less than 40 Å thick.

18. The method as claimed in claim 17 wherein said silicon nitride layer is about 10 Å to 25 Å thick.

19. The method as claimed in claim 14 wherein said step of doping comprises doping said lower electrode with a p-type dopant.

20. The method as claimed in claim 19 wherein said p-type dopant comprises boron.

21. The method as claimed in claim 14 wherein said step of doping comprises doping said lower electrode with an n-type dopant.

22. The method as claimed in claim 21 wherein said n-type dopant is selected from the group consisting of arsenic or phosphorous.

23. The method as claimed in claim 14 wherein said doping and said forming of said silicon nitride layer are carried out at a temperature of about 700–800° C.

24. A method of forming a capacitor:
forming a lower capacitor electrode;
placing said lower capacitor electrode in a vacuum;
doping said lower electrode in said vacuum;
forming a silicon nitride layer on the surface of said lower electrode, wherein said step of forming said silicon nitride layer comprises:
nitridizing said surface of said lower electrode in said vacuum using rapid thermal nitridization to form a first growth of silicon nitride subsequent to said doping;
nitridizing said first growth of silicon nitride in said vacuum using remote plasma nitridization to form a self-limiting second growth of silicon nitride, wherein said first growth and said second growth of silicon nitride together comprise said silicon nitride layer; and
forming an upper capacitor electrode.

25. The method as claimed in claim 24 wherein said rapid thermal nitridization utilizes NH$_3$ and said remote plasma nitridization utilizes N$_2$.

26. The method as claimed in claim 24 wherein said lower electrode comprises polysilicon.

27. The method as claimed in claim 24 wherein said lower electrode comprises hemispherical grained silicon.

28. The method as claimed in claim 24 wherein said silicon nitride layer is less than 40 Å thick.

29. The method as claimed in claim 28 wherein said silicon nitride layer is about 10–25 Å thick.

30. The method as claimed in claim 24 wherein said step of doping comprises doping said lower electrode with a p-type dopant.

31. The method as claimed in claim 30 wherein said p-type dopant comprises boron.

32. The method as claimed in claim 24 wherein said step of doping comprises doping said lower electrode with an n-type dopant.

33. The method as claimed in claim 34 wherein said n-type dopant is selected from the group consisting of arsenic or phosphorous.

34. The method as claimed in claim 24 wherein said doping and said forming of said silicon nitride layer are carried out at a temperature of about 700–800° C.

35. A method of forming a capacitor:
forming a lower capacitor electrode;
placing said lower capacitor electrode in a vacuum;
doping said lower electrode in said vacuum;
forming a silicon nitride layer on the surface of said lower electrode, wherein said step of forming said silicon nitride layer comprises:
nitridizing said surface of said lower electrode in said vacuum using remote plasma nitridization to form a first growth of silicon nitride subsequent to said doping;
nitridizing said first growth of silicon nitride in said vacuum using rapid thermal nitridization to form a self-limiting second growth of silicon nitride, wherein said first growth and said second growth of silicon nitride together comprise said silicon nitride layer; and
forming an upper capacitor electrode.

36. A method of forming a capacitor:
forming a lower capacitor electrode, wherein said electrode comprises polysilicon;
placing said lower capacitor electrode in a first process chamber under vacuum;
doping said lower electrode in said first process chamber, wherein said doping comprises a phosphorous anneal utilizing a rapid thermal process;
forming a silicon nitride layer less than about 40 Å thick on the surface of said lower electrode, wherein said step of forming said silicon nitride layer comprises:
nitridizing said surface of said lower electrode in said first process chamber using remote plasma nitridization utilizing NH$_3$ at a temperature of about 700–800° C. to form a first growth of silicon nitride;
placing said lower electrode in a second process chamber;
nitridizing said first growth of silicon nitride in said second process chamber using remote plasma nitridization utilizing N$_2$ at a temperature of about 700–800° C. to form a self-limiting second growth of silicon nitride, wherein said first growth and said second growth of silicon nitride together comprise said silicon nitride layer; and
forming an upper capacitor electrode.

37. The method as claimed in claim 36 wherein said silicon nitride layer is about 10–25 Å thick.

38. A method of forming a thin dielectric layer for use in a semiconductor device comprising:
providing a semiconductor substrate comprising polysilicon;
placing said semiconductor substrate in a process chamber, wherein said process chamber is under vacuum;
doping said semiconductor substrate in said process chamber, wherein said doping comprises a rapid thermal anneal utilizing a phosphorous, arsenic, or boron species;
nitridizing said surface of said substrate in said process chamber to form a first growth of silicon nitride; and
nitridizing said first growth of silicon nitride using remote plasma nitridization to form a self-limiting second growth of silicon nitride, wherein said first growth and said second growth of silicon nitride together comprise a silicon nitride layer.

39. The method as claimed in claim 38 wherein said silicon nitride layer is less than 40 Å thick.

40. The method as claimed in claim 39 wherein said silicon nitride layer is about 10–25 Å thick.

41. The method as claimed in claim 38 wherein said doping carried out at a temperature of about 700–800° C.

42. The method as claimed in claim 38 wherein said first growth and said second growth of said silicon nitride are carried out at a temperature of about 700–800° C.

43. A method of forming a thin dielectric layer for use in a semiconductor device comprising:
providing a semiconductor substrate comprising polysilicon;
placing said semiconductor substrate in a first process chamber, wherein said process chamber is under vacuum;
doping said semiconductor substrate in said first process chamber, wherein said doping comprises a rapid thermal anneal utilizing a phosphorous, arsenic, or boron species;
nitridizing said surface of said substrate in said first process chamber to form a first growth of silicon nitride;
placing said substrate in a second process chamber; and
nitridizing said first growth of silicon nitride in said second process chamber using remote plasma nitridization to form a self-limiting second growth of silicon nitride, wherein said first growth and said second growth of silicon nitride together comprise a silicon nitride layer.

44. The method as claimed in claim 43 wherein said silicon nitride layer is less than 40 Å thick.

45. The method as claimed in claim 44 wherein said silicon nitride layer is about 10–25 Å thick.

46. The method as claimed in claim 43 wherein said doping carried out at a temperature of about 700–800° C.

47. The method as claimed in claim 43 wherein said first growth and said second growth of said silicon nitride are carried out at a temperature of about 700–800° C.

48. A method of forming a tin dielectric layer for use in a semiconductor device comprising:

providing a semiconductor substrate comprising polysilicon;

placing said semiconductor substrate in a process chamber, wherein said process chamber is under vacuum;

doping said semiconductor substrate in said process chamber, wherein said doping comprises a rapid thermal anneal utilizing a phosphorous, arsenic, or boron species;

nitridizing said surface of said substrate in said process chamber during and after said doping using rapid thermal nitridization utilizing $NH_3$ carried out at a temperature of about 700–800° C. to form a first growth of silicon nitride; and nitridizing said first growth of silicon nitride in said process chamber using remote plasma nitridization utilizing $N_2$ carried out at a temperature of about 700–800° C. to form a self-limiting second growth of silicon nitride, wherein in said first growth and said second growth of silicon nitride together comprise a silicon nitride layer having a thickness of less than about 40 Å.

* * * * *